US012676601B2

(12) United States Patent
Nedic et al.

(10) Patent No.: US 12,676,601 B2
(45) Date of Patent: Jul. 7, 2026

(54) SYSTEMS AND METHODS FOR HIGH-VOLTAGE POWER INTEGRATED CIRCUITS

(71) Applicant: EPIRUS, INC., Torrance, CA (US)

(72) Inventors: Velimir Nedic, Los Angeles, CA (US); Denpol Kultran, Torrance, CA (US)

(73) Assignee: EPIRUS, INC., Torrance, CA (US)

( * ) Notice: Subject to any disclaimer, the term of this patent is extended or adjusted under 35 U.S.C. 154(b) by 0 days.

(21) Appl. No.: 18/619,982

(22) Filed: Mar. 28, 2024

(65) Prior Publication Data

US 2024/0333267 A1     Oct. 3, 2024

Related U.S. Application Data

(63) Continuation of application No. PCT/US2024/021436, filed on Mar. 26, 2024.

(60) Provisional application No. 63/455,201, filed on Mar. 28, 2023.

(51) Int. Cl.
*H03K 3/42*          (2006.01)
*H03K 17/56*         (2006.01)

(52) U.S. Cl.
CPC .............. *H03K 3/42* (2013.01); *H03K 17/56* (2013.01)

(58) Field of Classification Search
CPC .................................. H03K 3/42; H03K 17/56
See application file for complete search history.

(56) References Cited

U.S. PATENT DOCUMENTS

| | | | |
|---|---|---|---|
| 7,126,388 B2 * | 10/2006 | Harriman | H02M 7/538 |
| | | | 327/108 |
| 8,853,710 B2 | 10/2014 | Mazzola | |
| 11,211,703 B2 | 12/2021 | Marr et al. | |

(Continued)

FOREIGN PATENT DOCUMENTS

| | | |
|---|---|---|
| CN | 101473451 | 7/2009 |
| CN | 104158525 | 11/2014 |

(Continued)

OTHER PUBLICATIONS

Search Information Statement and Written Opinion in application No. PCT/US2024/021436, dated May 29, 2024, in 7 pages.

(Continued)

*Primary Examiner* — Daniel C Puentes

(74) *Attorney, Agent, or Firm* — Knobbe, Martens, Olson & Bear, LLP

(57) ABSTRACT

The present disclosure includes an integrated circuit having a housing, an optical port exposed on an exterior of the housing, and gate driver circuitry configured to generate a drive signal at an output of the integrated circuit to drive a gate terminal of a wide band gap (WBG) power device. The integrated circuit may include an optical receiver coupled to the optical port and having an electrical output coupled to an input of the gate driver circuitry, the optical receiver configured to receive an optical signal via the optical port and generate an electrical signal at the electrical output based on the optical signal. The integrated circuit may also include a power supply system configured to convert a first voltage to one or more power supply voltages powering the gate driver circuitry, the first voltage being a voltage at a terminal of the WBG power device.

20 Claims, 4 Drawing Sheets

(56) References Cited

U.S. PATENT DOCUMENTS

| | | | |
|---|---|---|---|
| 11,469,722 B2 | 10/2022 | Kultran et al. | |
| 11,616,295 B2 | 3/2023 | Marr et al. | |
| 11,658,410 B2 | 5/2023 | So et al. | |
| 2008/0007241 A1 * | 1/2008 | Isham | H02M 1/08 |
| | | | 323/285 |
| 2017/0272158 A1 | 9/2017 | Wang et al. | |
| 2022/0393669 A1 * | 12/2022 | Nojima | H03K 17/18 |

FOREIGN PATENT DOCUMENTS

| | | | | |
|---|---|---|---|---|
| EP | 1648086 A1 * | 4/2006 | | H10D 84/00 |
| WO | WO-2014133193 A1 * | 9/2014 | | G02B 6/4213 |
| WO | WO 2024/206282 | 10/2024 | | |

OTHER PUBLICATIONS

International Preliminary Report on Patentability and Written Opinion in application No. PCT/US2024/021436, dated Sep. 20, 2025, in 5 pages.

* cited by examiner

SYSTEMS AND METHODS FOR HIGH-VOLTAGE POWER INTEGRATED CIRCUITS

TECHNICAL FIELD

The present disclosure relates, in general, to power module packaging systems and methods and, more particularly, to scalable multi-die power module configurations for power grids.

BACKGROUND

In the field of power module packaging, there is a growing demand for scalable solutions capable of handling complex configurations while maintaining optimal power delivery and control. Existing approaches often rely on intricate circuit designs, which may have unfavorable limitations in terms of driving and sensing capabilities. However, more advanced solutions that offer faster switching speeds, reduced electromagnetic interference (EMI), and enhanced scalability across a broad spectrum of high-power and high-speed applications represent a promising area for the future growth.

SUMMARY

Disclosed herein are novel aspects of integrated circuits and power systems. The integrated circuit can include a housing, a first optical port exposed on an exterior of the housing, gate driver circuitry configured to generate a drive signal at an output terminal of the integrated circuit to drive a gate terminal of a wide band gap (WBG) power device, an optical receiver coupled to the first optical port and having a first electrical output coupled to an input of the gate driver circuitry, the optical receiver being configured to receive a first optical signal via the first optical port and generate a first electrical signal at the first electrical output based on the first optical signal, and a power supply system configured to convert or shift a first voltage to one or more power supply voltages powering the gate driver circuitry, the first voltage being a voltage at a terminal of the WBG power device.

The integrated circuit can include a sensing system configured to sense one or more operating characteristics of the WBG power device and generate a second electrical signal based on the one or more operating characteristics sensed. The integrated circuit can include a second optical port exposed on the exterior of the housing, and an optical transmitter having an optical output coupled to the second optical port and a first electrical input coupled to the sensing system, the optical transmitter configured to generate a second optical signal based on the second electrical signal received at the first electrical input.

The sensing can include an analog-to-digital converter (ADC) coupled to an input terminal of the integrated circuit and having a digital output, and an optical driver having a second electrical output coupled to the first electrical input of the optical transmitter and a second electrical input coupled to the digital output. During operation of the integrated circuit, the optical driver and the ADC are powered by the one or more power supply voltages.

The integrated circuit can include a non-dissipative current sensor coupled to an output of the WBG power device and configured to generate a sensed signal based on the output of the WBG power device. The WBG power device can be contained within the housing.

The gate driver circuitry can include a first amplifier coupled to the electrical output of the optical receiver and a gate driver having a driver input coupled to an output of the integrated circuit. The first amplifier and the gate driver can be powered by the one or more power supply voltages. The first amplifier can be a transimpedance amplifier. The power supply system can include a floating power supply, wherein the one or more supply voltages are generated relative to the first voltage.

BRIEF DESCRIPTION OF THE DRA WINGS

The accompanying drawings, which are incorporated in and constitute a part of this specification, show certain aspects of the subject matter disclosed herein and, together with the description, help explain some of the principles associated with the disclosed implementations.

DETAILED DESCRIPTION

The present disclosure provides examples of apparatuses, systems, and methods for implementing high-voltage power integrated circuits (PICs). In various implementations, the present disclosure introduces a scalable solution catering to the demands of high-density, multi-die power module packaging, addressing both current and future requirements of power grids. In various implementation, the disclosure outlines systems and methods for employing high-voltage power integrated circuits (PICs) capable of driving vertical Gallium Nitride (vGaN) Junction Field Effect Transistors (JFET), ensuring optimized power delivery. These systems and methods encompass the integrating of silicon photonic-based gate drivers and compact planar Rogowski coil-based current sensors with vGaN semiconductor devices. In various implementations, the gate drivers and current sensors are self-powered, with their switching speeds finely tuned to synchronized with the semiconductor devices for optimal performance.

In various aspects, the disclosed systems and methods offers a suite of advantages, including EMI reduction, enhanced scalability, simplified design of multi-die power module, and the provision for higher control bandwidth.

The term "set," as used herein (e.g., a set of keys), refers to a non-empty collection of members. The phrase "coupled to," as used herein and unless otherwise indicated by the context of the usage, refers to a connection or link between two or more members. Such connection or link may be physical and/or electrical and should be broadly construed to include an indirect connection or link.

Figure 1:
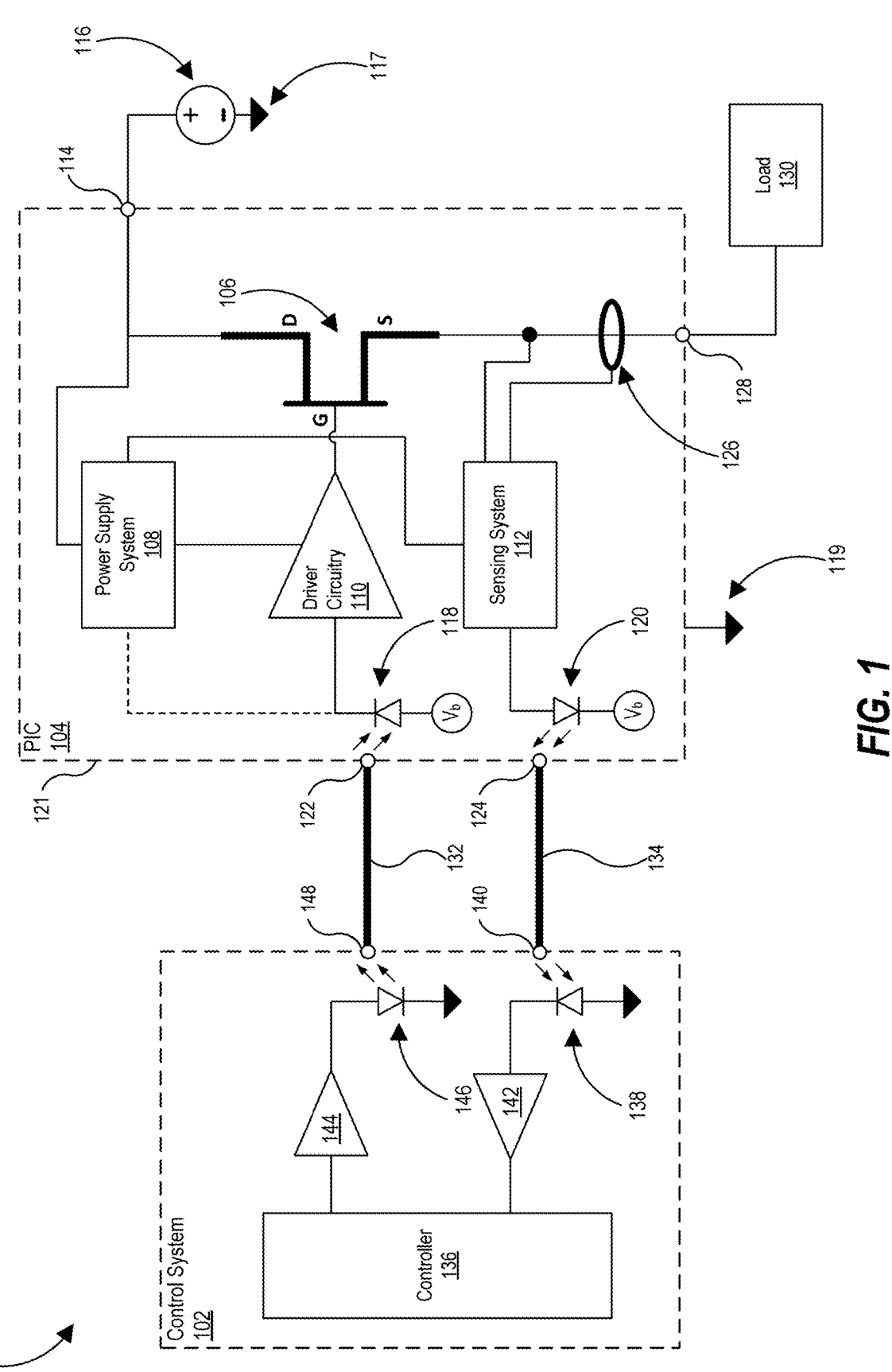
FIG. 1 illustrates a simplified block diagram of a power system 100 for supplying and controlling power provided to a WBG semiconductor power device.

FIG. 1 shows a simplified block diagram of a power system 100 for supplying and controlling power provided to a WBG semiconductor power device. The power system 100 includes a control system 102, a PIC 104, and a power device 106. The power system 100 can be configured to provide high-voltage (e.g., at least 1 kV) and/or high-current (e.g., at least 10 Amps) to a load coupled to the power device 106. The power system 100 can be configured to operate the power device 106 at a switching frequency of greater than 1 kHz—for example, at a switching frequency of approximately 100 kHz at a voltage output of 3.3 kV and/or a current output of at least 10 Amps. The power device 106 can be integrated with or be part of the PIC 104.

Certain Wide Band Gap (WBG) semiconductor power devices, such as vertical Gallium Nitride (vGaN), offer power density and switching rates orders of magnitude higher than equivalent Silicon semiconductor power devices. The power device 106 can be a WBG power device that includes a WBG semiconductor material, such as Gallium Nitride (GaN) or Silicon Carbide (SiC), offering superior thermal conductivity, power density, and switching frequency relative to conventional semiconductors, such as Silicon. The power device 106 may be vertically integrated devices—for example, vertical GaN (vGaN JFETs) or vertical SiC (vSiC DMOSFET).

The PIC 104 is, in some implementations, an application-specific integrated circuit (ASIC) having circuitry specifically configured or hard-wired as described herein. The PIC 104 includes a power supply system 108, gate driver circuitry 110, and a sensing system 112. The PIC 104 includes a power input terminal 114 for coupling an input voltage Vin from an external power source 116. The external power source 116 provides a high-voltage input of 1 kV or greater. The power input terminal 114 can be coupled to a first terminal (e.g., a drain terminal) of the power device 106.

The power supply system 108 can be coupled to a supply node of the gate driver circuitry 110 and configured to provide a first supply voltage thereto. The power supply system 108 can be configured to provide a second supply voltage to power the sensing system 112. The second supply voltage may be a different voltage level than the first supply voltage. The first and second supply voltages may be substantially lower than the input voltage—for instance, in the range of 5V to 15V. The power supply system 108 may have a voltage input terminal coupled to the input voltage to the power device 106, such as the terminal of the power source 116. The power supply system 108 may include voltage regulation circuitry that converts the voltage received at the voltage input terminal of the power supply system 108 to one or more supply voltages.

The PIC 104 includes an optical receiver 118 electrically coupled to an input of the driver circuitry 110 and an optical transmitter 120 electrically coupled to an output of the sensing system 112. The optical receiver 118 can be optically coupled to an optical port 122 of the PIC 104 and the optical transmitter 120 can be optically coupled to an optical port 124 of the PIC 104. The optical receiver 118 includes a high-speed photodiode that generates an electrical signal based on an optical signal received via the optical port 122. The electrical signal generated by the optical receiver 118 causes the driver circuitry 110 to selectively drive the gate of the power device 106. The PIC 104 includes a housing 121 in which the internal components are contained. The optical port 122 and the optical port 124 are exposed on an exterior of the housing 121.

The optical signal received by the optical receiver 118 may be a pulsed signal in which the signal transitions between an off state and an on state at a desired switching frequency of the output voltage (e.g., the first voltage). The optical signal may be controlled by the control system 102 to achieve an output having a desired set of operating characteristics (e.g., voltage level, switching frequency). The control system 102 may modulate the width of the optical signal to control a pulse-width of the electrical signal generated by the optical receiver 118. Accordingly, the electrical signal generated by the optical receiver 118 may be a pulse-width modulated signal having a desired pulse width.

The power supply system 108 may be a floating power supply in which the supply voltage can be generated relative to a reference voltage, which may be the first voltage (e.g., at the supply terminal of the power device 106). The power supply system 108 may be coupled to an output of the optical receiver 118. The power supply system 108 may include a voltage integrator or charge pump that charges over time as a result of voltage provided by the optical receiver 118. The power supply system 108 may activate as a result of the voltage integrator or charge pump reaching a certain voltage threshold. The power supply system 108 may include voltage regulation circuitry to maintain a level of one or more supply voltages, may include low dropout (LDO) voltage regulation circuitry, and/or filtering circuitry, by way of non-limiting example.

The power supply system 108 may include bootstrap circuitry (e.g., a series capacitor) for bootstrapping the first voltage. In operation, the first voltage level may have a switching frequency controlled by the output of the optical receiver 118 into the driver circuitry 110. The power supply system 108 may include galvanic isolation isolating the reference voltage from the one or more supply voltages generated. The power supply system 108 may include oscillation and/or modulation circuitry configured to generate a modulated signal provided to a primary side of the galvanic isolation. The primary side of the galvanic isolation may be referenced relative to a power ground 117 of the power source 116. The secondary side of the galvanic isolation may be referenced relative to a second ground 119 coupled to a terminal of the PIC 104. The secondary side of the galvanic isolation may include circuitry (e.g., demodulator) for demodulating the modulated or oscillated voltage on the primary side to provide one or more DC voltage levels.

The PIC 104 can include or can be coupled to a non-dissipative current sensor 126 that can be coupled to and configured to measure a current outputted by a terminal (e.g., source terminal) of the power device 106. The current sensor 126 is, in some implementations, a Ragowski coil. The current sensor 126 can be a Hall effect sensor. The current sensor 126 may include a current mirror arranged to generate a current proportional to the current flowing through the power device 106 by way of non-limiting example.

The current sensor 126 can be coupled to an output terminal 128 of the PIC 104. The current sensor 126 may be external to the PIC 104 and coupled to the output terminal 128. For instance, the current sensor 126 may be a separate module on a circuit board or other substrate that can be configured to provide a signal or data to the sensing system 112 indicating a current flowing from the output terminal 128. The output terminal 128 can be coupled to a load 130 that receives a high voltage (e.g., 1 kV, 3.3 kV) for operation.

The sensing system 112 can be coupled to the current sensor 126 and configured to generate an electrical signal corresponding to the current sensed by the current sensor 126. The electrical signal generated by the sensing system 112 can be outputted to the optical transmitter 120. The optical transmitter 120 may be a laser (e.g., vertical cavity surface-emitting laser, Fabry-Perot laser, distributed-feedback laser), a light emitting diode, or other light emitting device that generates an optical signal based on the electrical signal provided by the sensing system 112. An optical output of the optical transmitter 120 can be coupled to the optical port 124.

The sensing system 112, in some implementations, includes a comparator that can be configured to transition between a first mode in which a first voltage level (e.g., 0 Vdc) can be emitted at an output of the comparator and a second mode in which a second voltage (e.g., 5 Vdc) can be generated at the output of the comparator. During operation, a voltage reference may be provided at a first input terminal of the comparator and the voltage reference may be compared to a sense voltage at a second input of the comparator. The sense voltage may be generated based on one or more sensed characteristics (e.g., sensed output current of the power device 106, a sensed output voltage of the power device 106, a sensed temperature of the power device 106). In response to determining that the sense voltage exceeds the voltage reference, the sensing system 112 may transition between the first mode and the second mode. As a result, the optical transmitter 120 may begin generating an optical signal transmitted via the optical port 124.

The sensing system 112 may be configured to sense parameters other than current. For instance, the sensing system 112 may be coupled to a terminal of the power device 106 (e.g., source terminal) and configured to sense a voltage at the terminal. The PIC 104 may include a temperature sensor (e.g., thermistor, resistance temperature detectors) coupled to measure a temperature of the power device 106. The sensing system 112 may generate an output provided to the optical transmitter 120 based on the voltage and/or temperature measured. The sensing system 112 may be configured to measure other operational characteristics of the power device 106, such as gate-to-source voltage, drain-to-source voltage, and/or drain current.

The control system 102 can be optically coupled to the PIC 104 via a first optical fiber 132 and a second optical fiber 134. The control system 102 includes a controller 136 that can be configured to control operation of the PIC 104 via the first and second optical fibers 132 and 134. The controller 136, in some implementations, includes programmable logic blocks hardwired to perform as described herein. For instance, the controller 136 may be a Field Programmable Gate Array (FPGA) that can be programmed via hardware design language to control the PIC 104. The controller 136 can be a microcontroller that includes one or more processor cores and may include or be coupled to memory that stores instructions that, as a result of execution, causes the one or more processor cores to perform as described herein. Non-limiting examples of such microcontrollers include those manufactured by ARM, Renesas, and Infineon.

The control system 102 includes an optical receiver 138 having an optical input coupled to an optical port 140. The optical receiver 138 includes a semiconductor device configured to generate an electric signal based on the optical signal received over the second optical fiber 134. An electrical output of the optical receiver 138 can be coupled to amplification circuitry 142, which includes one or more amplifiers configured to amplify the electrical signal generated by the optical receiver 138. The amplification circuitry 142 may include an analog-to-digital converter (ADC) that converts the electrical signal generated by the optical receiver 138 into a digital signal to be processed by the controller 136.

The controller 136 controls the PIC 104 based on the signal generated by the optical receiver 138. More particularly, the control system 102 includes an optical driver 144 coupled to one or more IO ports of the controller 136. An output of the optical driver 144 can be coupled to an optical transmitter 146 configured to generate an optical signal based on output from the controller 136. The optical driver

144 may include a driver amplifier that amplifies the electric signal generated by the controller 136. The optical transmitter 146 may include a semiconductor laser device having an output coupled to an optical modulator. An output of the optical driver 144 may be coupled to the optical modulator and the electrical signal issued by the optical driver 144 modulates the output of the laser device. The optical output of the optical transmitter 146 can be coupled to an optical port 148 of the control system 102 through which the modulated laser can be transmitted to the PIC 104 via the first optical fiber. This optical data transmission offers advantages such as reduce electro-magnetic interference (EMI) and high-speed control of the overall system.

Figure 2:
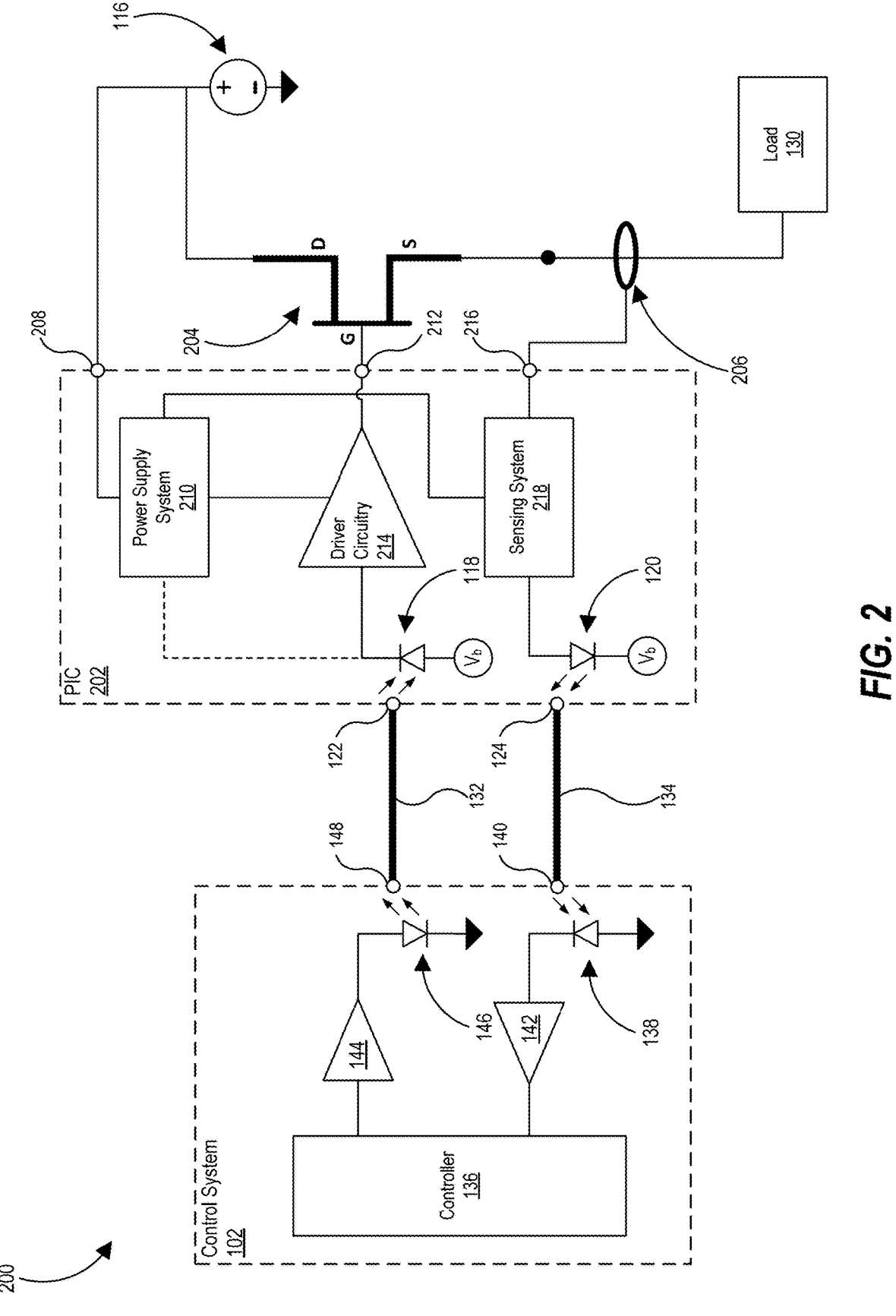
FIG. 2 illustrates a simplified block diagram of a power system 100 for supplying and controlling power provided to a WBG semiconductor power device.

FIG. 2 illustrates a simplified block diagram of a power system 200 for supplying and controlling power provided to a WBG semiconductor power device. Various features of the power system 200 are substantially similar to features of the power system 100 so further discussion thereof is omitted for brevity. The power system 200 includes a PIC 202 that can be electrically coupled to a power device 204 that can be a WBG semiconductor power device as described with respect to FIG. 1. The power device 204 can be separate from and external to the PIC 202 in the power system 200. The power system 200 also includes a current sensor 206, as described with respect to FIG. 1. The current sensor 206 can be separate from and external to the PIC 202.

The PIC 202 includes a power terminal 208 for coupling to a first terminal (e.g., drain terminal) of the power device 204. The power terminal 208 can be internally coupled to a power supply system 210, which can be substantially similar to the power supply system 108 described with respect to FIG. 1. The PIC 202 includes an output terminal 212 for coupling to a second terminal (e.g., gate terminal) of the power device 204. The output terminal 212 can be internally coupled to driver circuitry 214, which can be substantially similar to the driver circuitry 110 described with respect to FIG. 1. The PIC 202 further includes a sensing terminal 216 for coupling to the current sensor 206. The sensing terminal 216 can be internally coupled to a sensing system 218, which can be substantially similar to the sensing system 218.

Figure 3:
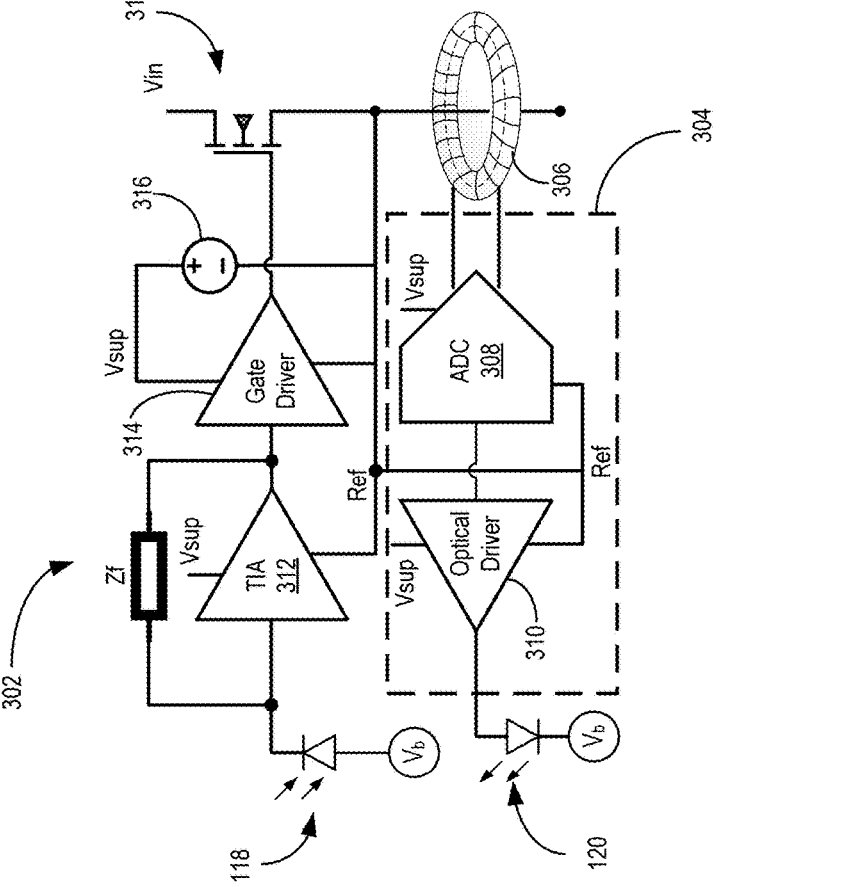
FIG. 3 illustrates a diagram of a set of subsystems of a power integrated circuit.

FIG. 3 illustrates a diagram of a set of subsystems 300 of a PIC. The set of subsystems include driver circuitry 302 and a sensing system 304. The sensing system 304 includes a current sensor 306, an analog-to-digital converter (ADC) 308, and an optical driver 310, which are directly or indirectly connected to components including the optical transmitter 120, the optical receiver 118. The driver circuitry 302 includes an amplifier 312, a gate driver 314, a voltage system 316, and a power device 318.

In various implementations, the current sensor 306 can be a compact planar Rogowski coil and the ADC 308 can be a sigma-delta modulator (SDM) designed to digitize the output of the current sensor 306. Depending on the requirements, the SDM may offer resolutions ranging from 1 bit to a plurality of bits.

In various implementations, where the ADC 308 provides multiple bits of resolution, the PIC may include multiple optical transmitters 120 and corresponding optical drivers 310, enhancing the power module's control over the operation of the power device 318.

In various implementations, the optical driver 310 can be semiconductor device capable of directly modulating the light output of the optical transmitter 120 based on the output of the ADC 308.

In FIG. 3, the output of the optical receiver 118 can be amplified by an amplifier 312 before being routed as input to the gate driver 314. In some implementations, the amplifier 312 may be implemented as a transimpedance amplifier, designed to convert the current signal from the optical receiver 118 into a voltage signal suitable for driving the gate driver 314.

In various implementations, both the gate driver 314 and the optical driver 310 may be self-powered, drawing power from the power supply system 316 intended for the power device 318. Additionally, the power supply system 316 may include a power conversion circuitry configured to transform power from a first voltage (e.g., voltage at drain terminal, input voltage Vin) to a second voltage suitable for supplying power to components such as the gate driver 314, the amplifier 312, the optical driver 310, and/or the ADC 308. The second voltage may be lower than the first voltage in some implementations—for instance, the second voltage may be in the range of 5V to 15V.

In various implementations, the PIC may include a plurality of optical receivers 118 connected to one or more amplifiers 312. For example, the plurality of receivers 118 may be connected in parallel to the amplifier 312, allowing the control system 103 to activate a subset of plurality of optical receivers 118 via a corresponding set of optical links. This activation facilitates the provision of a desired gate bias voltage to the power device 318.

In various implementations, the power device 318 can be a wide bandgap (WBG) semiconductor device, such as vGaN, offering higher power density and faster switching rates compared to regular silicon devices. While higher switching frequency at higher power level can be desirable, it can lead to increased EMI, potentially affecting the performance of other electronic components and the overall system. The power device 318, made of vGaN on a GaN/SiC substrate, features decoupled on-resistance and breakdown voltage, enabling higher switching speed. Additionally, the power device 318 can be 2-10 times smaller than silicon power devices and has lower capacitance ratio during switching transients, allowing for much higher switching frequency and lower switching losses. In various implementations, the PIC can be an application-specific integrated circuit (ASIC) with multiple terminals or pins for connection to the WBG vertical GaN device.

The implementations disclosed herein overcome the challenge of utilizing vertical GaN power device and simplifying its use in complex topologies by using optical coupling and a self-powered design. Existing isolation methods based on optical coupling are not designed to interface with modern WBG power devices. In contrast, the implementations disclosed herein utilize integration of silicon photonics with high voltage bipolar CMOS DMOS (BCD) and vertical GaN technology to allow fast actuation and sensing for control of power devices for many applications in power electronics. Silicon photonics can advantageously provide high speed, isolation. Locally powered, optically isolated, interfaces between the control stage and the power device provide a scalability path independent of the power device and enable easier adoption of computationally intense control algorithms and artificial intelligence (AI) techniques for device control and management. The PIC can be used to drive power devices 105 with breakdown voltage of 3.3 kV and continuous current rating exceeding 50 A. Multiple power modules comprising PIC connected to a power device 318 can be connected together to provide voltage converters for grid applications with voltage requirements greater than or equal to 3.3 kilo Volts, current requirements greater than or equal to 10 A and switching frequency between 1 kHz and 100 kHz.

Figure 4:
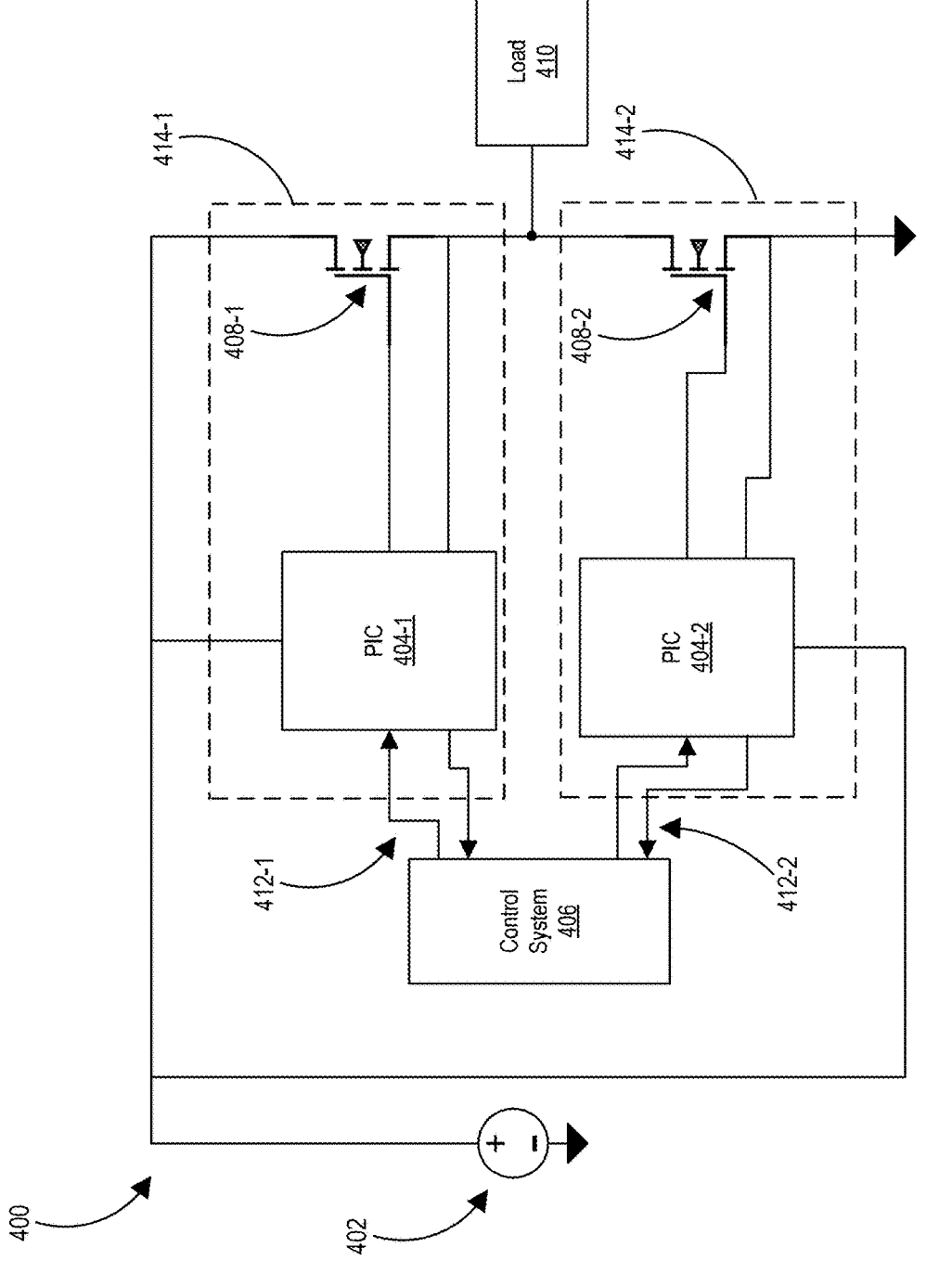
FIG. 4 illustrates a simplified block diagram of a power system.

FIG. 4 illustrates a simplified block diagram of a power system. The power system 400 includes a power source 402, a first PIC 404-1, a second PIC 402-2, and a control system 406 for controlling the first and second PICs 404-1 and 404-2. The power system 400 also includes a first WBG power device 408-1 and a second power device 408-2 respectively coupled to outputs of the first and second PICs 404-1 and 404-2. Various components of the power system 400 correspond to features described with respect to those described with respect to FIGS. 1 through 3 so further description thereof is omitted for brevity.

The first and second power devices 408-1 and 408-2 are connected together in a half bridge configuration with an output node of the power system 400 coupled to a load 410. The power system 400 can be configured to generate an alternating current voltage (Vac) at the output node. The power system 400 can be configured to configured to generate a direct current voltage (Vdc) at the output node, the Vdc being lower than the power source 402.

The control system 406 can be configured to optically control operation of the PIC 404-1 via a first set of optical fibers 412-1. The control system 406 can be configured to optically control operation of the PIC 404-2 via a second set of optical fibers 412-2. The control system 406 may control the first PIC 404-1 independently of control of the second PIC 404-2.

In some implementations, the first PIC 404-1 and the first power device 408-1 are integrated into a single first package 414-1 and the second PIC 404-2 and the second power device 408-2 are integrated into a second single package 414-2 separate than the first single package. In some cases, the first and second PICs 404-1 and 404-2 and the first and second power devices 408-1 and 408-2 are integrated into a single package.

Other Variations

Features, materials, characteristics, or groups described in conjunction with a particular aspect, embodiment, or example are to be understood to be applicable to any other aspect, embodiment or example described herein unless incompatible therewith. All the features disclosed in this specification (including any accompanying claims, abstract and drawings), and/or all the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

While certain embodiments have been described, these embodiments have been presented by way of example only and are not intended to limit the scope of protection. Indeed, the novel methods and systems described herein may be embodied in a variety of other forms. Furthermore, various omissions, substitutions, and changes in the form of the methods and systems described herein may be made. Those skilled in the art will appreciate that in some embodiments, the actual steps taken in the processes disclosed and/or illustrated may differ from those shown in the figures. Depending on the embodiment, certain of the steps described above may be removed, others may be added. For example, the actual steps and/or order of steps taken in the disclosed processes may differ from those described and/or shown in the figure. Depending on the embodiment, certain of the steps described above may be removed, others may be added. For instance, the various components illustrated in the figures and/or described may be implemented as software and/or firmware on a processor, controller, ASIC, FPGA, and/or dedicated hardware. Furthermore, the features and attributes of the specific embodiments disclosed above may be combined in different ways to form additional embodiments, all of which fall within the scope of the present disclosure.

In some cases, there can be provided a non-transitory computer readable medium storing instructions, which when executed by at least one computing or processing device, cause performing any of the methods as generally shown or described herein and equivalents thereof.

Any of the memory components described herein can include volatile memory, such random-access memory (RAM), dynamic random-access memory (DRAM), synchronous dynamic random-access memory (SDRAM), double data rate (DDR) memory, static random-access memory (SRAM), other volatile memory, or any combination thereof. Any of the memory components described herein can include non-volatile memory, such as magnetic storage, flash integrated circuits, read only memory (ROM), Chalcogenide random access memory (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

Any user interface screens illustrated and described herein can include additional and/or alternative components. These components can include menus, lists, buttons, text boxes, labels, radio buttons, scroll bars, sliders, checkboxes, combo boxes, status bars, dialog boxes, windows, and the like. User interface screens can include additional and/or alternative information. Components can be arranged, grouped, displayed in any suitable order.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without other input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, or within less than 0.01% of the stated amount.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations.

The foregoing description, for purposes of explanation, used specific nomenclature to provide a thorough understanding of the disclosure. However, it will be apparent to one skilled in the art that specific details are not required in order to practice the disclosed embodiments. Thus, the foregoing descriptions of specific embodiments are presented for purposes of illustration and description. They are not intended to be exhaustive or to limit the disclosure to the precise forms disclosed; obviously, many modifications and variations are possible in view of the above teachings. The embodiments were chosen and described in order to best explain the principles of the disclosure and its practical applications, they thereby enable others skilled in the art to best utilize the disclosure and various embodiments with various modifications as are suited to the particular use contemplated. It is intended that the claims as presented herein or as presented in the future and their equivalents define the scope of the protection.

The invention claimed is:

1. An integrated circuit, comprising:
a housing;
a first optical port exposed on an exterior of the housing;
gate driver circuitry configured to generate a drive signal at an output terminal of the integrated circuit to drive a gate terminal of a wide band gap (WBG) power device;
an optical receiver coupled to the first optical port and including a first electrical output coupled to an input of the gate driver circuitry, the optical receiver configured to receive a first optical signal via the first optical port and generate a first electrical signal at the first electrical output based on the first optical signal; and
a power supply system configured to convert a first voltage to one or more power supply voltages powering the gate driver circuitry, the first voltage being a voltage at a drain terminal of the WBG power device.

2. The integrated circuit of claim 1, further comprising:
a sensing system configured to sense one or more operating characteristics of the WBG power device and generate a second electrical signal based on the one or more operating characteristics sensed and cause adjustment of the drive signal generated by the gate driver circuitry.

3. The integrated circuit of claim 2, further comprising:
a second optical port exposed on the exterior of the housing; and
an optical transmitter including an optical output coupled to the second optical port and a first electrical input coupled to the sensing system, the optical transmitter configured to generate a second optical signal based on the second electrical signal received at the first electrical input.

4. The integrated circuit of claim 3, wherein the sensing system includes:

an analog-to-digital converter (ADC) coupled to an input terminal of the integrated circuit and including a digital output; and an optical driver including a second electrical output coupled to the first electrical input of the optical transmitter and a second electrical input coupled to the digital output.

5. The integrated circuit of claim 4, wherein, during operation, the optical driver and the ADC are powered by the one or more power supply voltages.

6. The integrated circuit of claim 2, further comprising:

a non-dissipative current sensor coupled to an output of the WBG power device and configured to generate a sensed signal based on the output of the WBG power device.

7. The integrated circuit of claim 1, wherein the WBG power device is contained within the housing.

8. The integrated circuit of claim 1, wherein the gate driver circuitry includes a first amplifier coupled to the first electrical output of the optical receiver and a gate driver including a driver input coupled to the output terminal of the integrated circuit.

9. The integrated circuit of claim 8, wherein the first amplifier and the gate driver are powered by the one or more power supply voltages.

10. The integrated circuit of claim 8, wherein the first amplifier is a transimpedance amplifier.

11. A system, comprising:

a wide band gap (WBG) power device;

an integrated circuit including:

gate driver circuitry including a first electrical input, the gate driver circuitry coupled to a gate terminal of the WBG power device and configured to generate a drive signal;

a first optical receiver including a first optical input and a first electrical output coupled to an input of the gate driver circuitry, the first optical receiver configured to receive a first optical signal and generate a first electrical signal at the first electrical output based on the first optical signal; and a power supply system configured to convert a first voltage received at an input power terminal of the integrated circuit to a set of power supply voltages at a set of output power terminals, the input power terminal coupled to a drain terminal of the WBG power device, at least one power supply voltage of the set of power supply voltages powering the gate driver circuitry; and a control system optically coupled to the first optical receiver and configured to control generate and modulate the first optical signal to control one or more electrical characteristics of the drive signal.

12. The system of claim 11, wherein the control system includes:

a first optical transmitter including a second electrical input and a first optical output optically coupled to the first optical input, the first optical transmitter configured to receive a second electrical signal at the first electrical input and generate a second optical signal at the first optical output based on the first electrical signal;

a first optical driver including a first driver output coupled to the second electrical input and including a third electrical input; and a controller including a control output coupled to the third electrical input, the controller configured to generate a modulated signal at the control output controlling the one or more electrical characteristics of the drive signal.

13. The system of claim 12, wherein the integrated circuit further comprises:

a second optical output and is configured to sense one or more operating characteristics of the WBG power device and generate a third optical signal at the second optical output based on the one or more operating characteristics sensed, and the control system further comprises:

a second optical input optically coupled to the second optical input to receive the third optical signal, the control system configured to adjust the modulated signal based on the third optical signal received.

14. The system of claim 12, wherein the integrated circuit further comprises:

a sensing system including one or more sensors coupled to the WBG power device, the sensing system configured to sense one or more operating characteristics of the WBG power device and generate a third electrical signal based on the one or more operating characteristics sensed; and a second optical transmitter having a fourth electrical input coupled to the sensing system and a second optical output, the second optical transmitter configured to generate a fourth optical signal at the second optical output based on the third electrical signal received at the fourth electrical input.

15. The system of claim 11, wherein the integrated circuit is contained within a housing and the WBG power device is contained within the housing.

16. The system of claim 11, wherein the integrated circuit is contained within a housing and the WBG power device is external to the housing.

17. The system of claim 11, wherein the set of power supply voltages powers the gate driver circuitry and the gate driver circuitry includes a transimpedance amplifier coupled to a gate driver amplifier.

18. The system of claim 11, wherein the integrated circuit further comprises:

a sensing system powered by the set of power supply voltages and including:

an analog-to-digital converter (ADC) coupled to receive a set of analog signals representing one or more operating characteristics of the WBG power device and generate a set of digital signals at a digital output based on the set of analog signals; and an optical driver coupled to the digital output and configured to generate a second electrical signal at a second electrical output of the optical driver based on the set of digital signals.

19. The system of claim 18, wherein the integrated circuit further comprises:

an optical transmitter coupled to the second electrical output and including a first optical output optically coupled to the control system, the optical transmitter configured to generate a second optical signal at the first optical output based on the second electrical signal, wherein the control system is optically coupled to receive the second optical signal generated by the optical transmitter and configured to control generate and modulate the first optical signal based on the second optical signal.

20. The system of claim 18, further comprising:

a non-dissipative current sensor arranged to sense a current at a supply terminal of the WBG power device, the non-dissipative current sensor coupled to the ADC.

* * * * *